United States Patent [19]

Nakazawa

[11] Patent Number: 5,067,091

[45] Date of Patent: Nov. 19, 1991

[54] CIRCUIT DESIGN CONVERSION APPARATUS

[75] Inventor: Masahisa Nakazawa, Kawasaki, Japan

[73] Assignee: Kabushiki Kaisha Toshiba, Kawasaki, Japan

[21] Appl. No.: 298,909

[22] Filed: Jan. 19, 1989

[30] Foreign Application Priority Data

| Jan. 21, 1988 [JP] | Japan | 63-11382 |
| Mar. 31, 1988 [JP] | Japan | 63-76092 |
| Nov. 7, 1988 [JP] | Japan | 63-279301 |

[51] Int. Cl.$^5$ .............................. G06F 15/60
[52] U.S. Cl. .................... 364/490; 364/489; 364/488; 371/22.3
[58] Field of Search ............ 364/488, 489, 490, 491, 364/513; 371/22.3

[56] References Cited

U.S. PATENT DOCUMENTS

| 4,691,161 | 9/1987 | Kant et al. | 371/22.3 |
| 4,803,636 | 2/1989 | Nishiyama et al. | 364/491 |

FOREIGN PATENT DOCUMENTS 0080883 3/1989 Japan .............................. 371/22.3

OTHER PUBLICATIONS

"A Logic Design Structure for LSI Testability", by Eichelberger et al., IEEE 1977, pp. 206-212.

Proceedings Custom Integrated Circuits Conference, pp. 195-163, "Automation in Design for Testability"; Agrawal et al., May 1984.

Aida Corporation Catalog, "Scan Ring Generation Program-Scangen—", John J. Zasio; 1987.

Computer Design, "Testability System Reduces Scan Path Penalty"; Richard Goering; Aug. 15, 1986.

Primary Examiner—Parshotam S. Lall
Assistant Examiner—V. N. Trans
Attorney, Agent, or Firm—Oblon, Spivak, McClelland, Maier & Neustadt

[57] ABSTRACT

A circuit design conversion apparatus comprises hierarchical circuit data memory, hierarchical structure analyzer, hierarchical structure data memory, conversion module register, conversion rule memory, conversion module table memory, conversion control unit, module pick-up unit, circuit design conversion unit and conversion rule remake unit. Circuit connection data which hierarchically described the connection of an LSI is input to the hierarchial circuit data memory. Hierarchical structure analyzer analyzes the circuit structure to obtain a hierarchical structure data, which in turn is stored in the hierarchical structure data memory. The name of a module, to be scan designed, is initially registered in the conversion rule memory. Considering the hierarchical structure data and the conversion rule the name of a module higher in level than the module registered in the conversion rule is registered in conversion module table memory which includes a pointer for representing a modules to be scan designed next. Conversion control unit supplies, to module pick-up unit, the name of a module which is pointed by a pointer. Module pick-up unit picks up circuit connection data, relating to that module, from the hierarchical circuit data memory, and supplies it to circuit design conversion unit to convert into a scan design relating to that module.

14 Claims, 18 Drawing Sheets

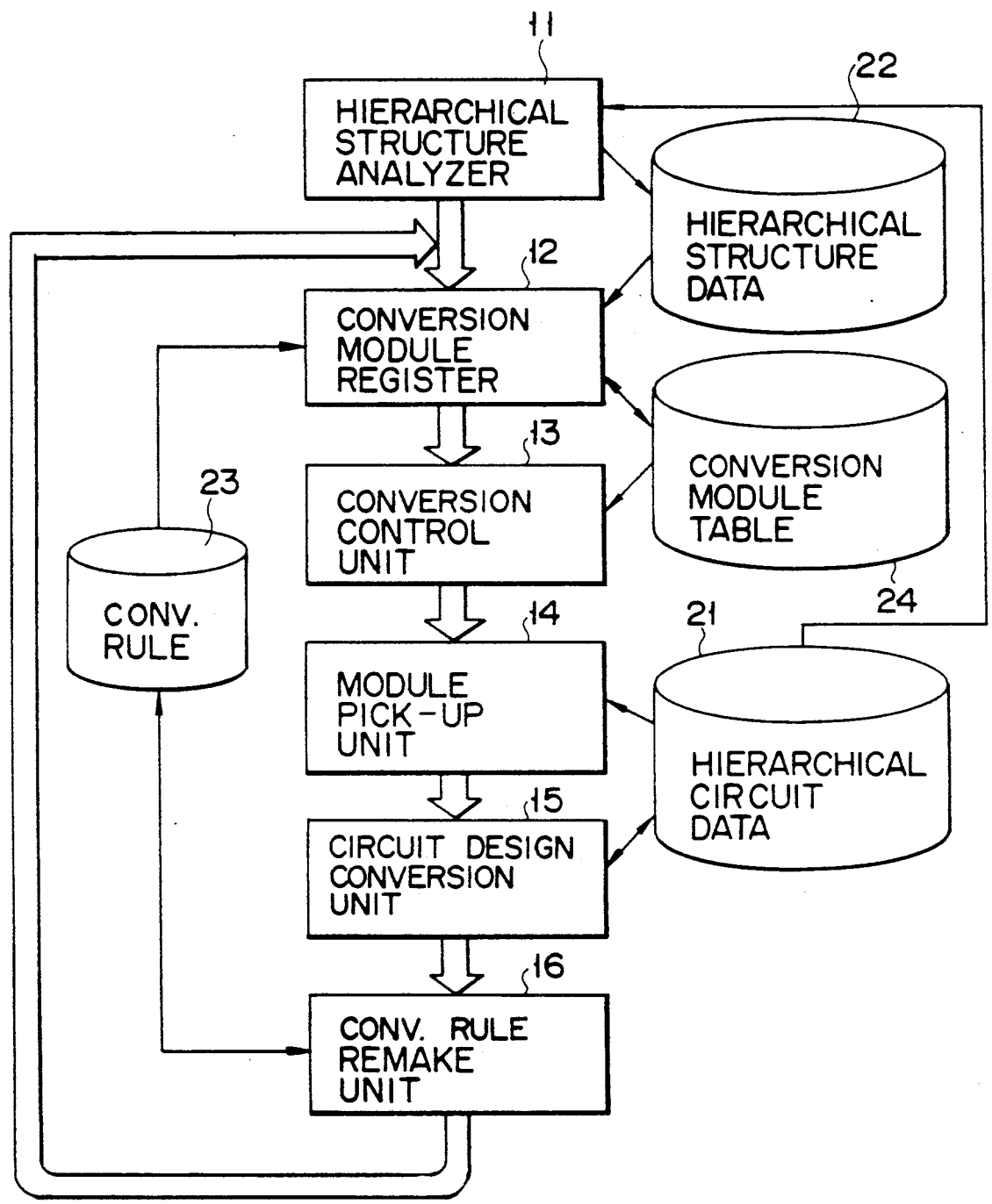
F I G. 5

FIG. 12A

| MODULE F/F |
|---|
| .... |

FIG. 12B

| MODULE F/F |
|---|
| .... |
| MODULE O |
| MODULE P |
| MODULE R |

FIG. 12C

| MODULE F/F |
|---|
| .... |
| MODULE O |
| MODULE P |
| MODULE R |
| MODULE Q |

FIG. 12D

| MODULE F/F |
|---|
| .... |
| MODULE O |
| MODULE P |
| MODULE R |
| MODULE Q |
| MODULE S |

FIG. 13A

| | |
|---|---|
| P | MODULE O |
| | MODULE P |
| | MODULE R |

FIG. 13B

| | |
|---|---|
| | MODULE O |
| | MODULE P |
| | MODULE R |
| P | MODULE Q |
| | MODULE S |

FIG. 13C

| | |
|---|---|
| | MODULE O |
| | MODULE P |
| | MODULE R |
| | MODULE Q |
| P | MODULE S |
| | MODULE T |

FIG. 13D

| | |
|---|---|
| | MODULE O |
| | MODULE P |
| | MODULE Q |
| | MODULE R |
| | MODULE S |
| P | MODULE T |

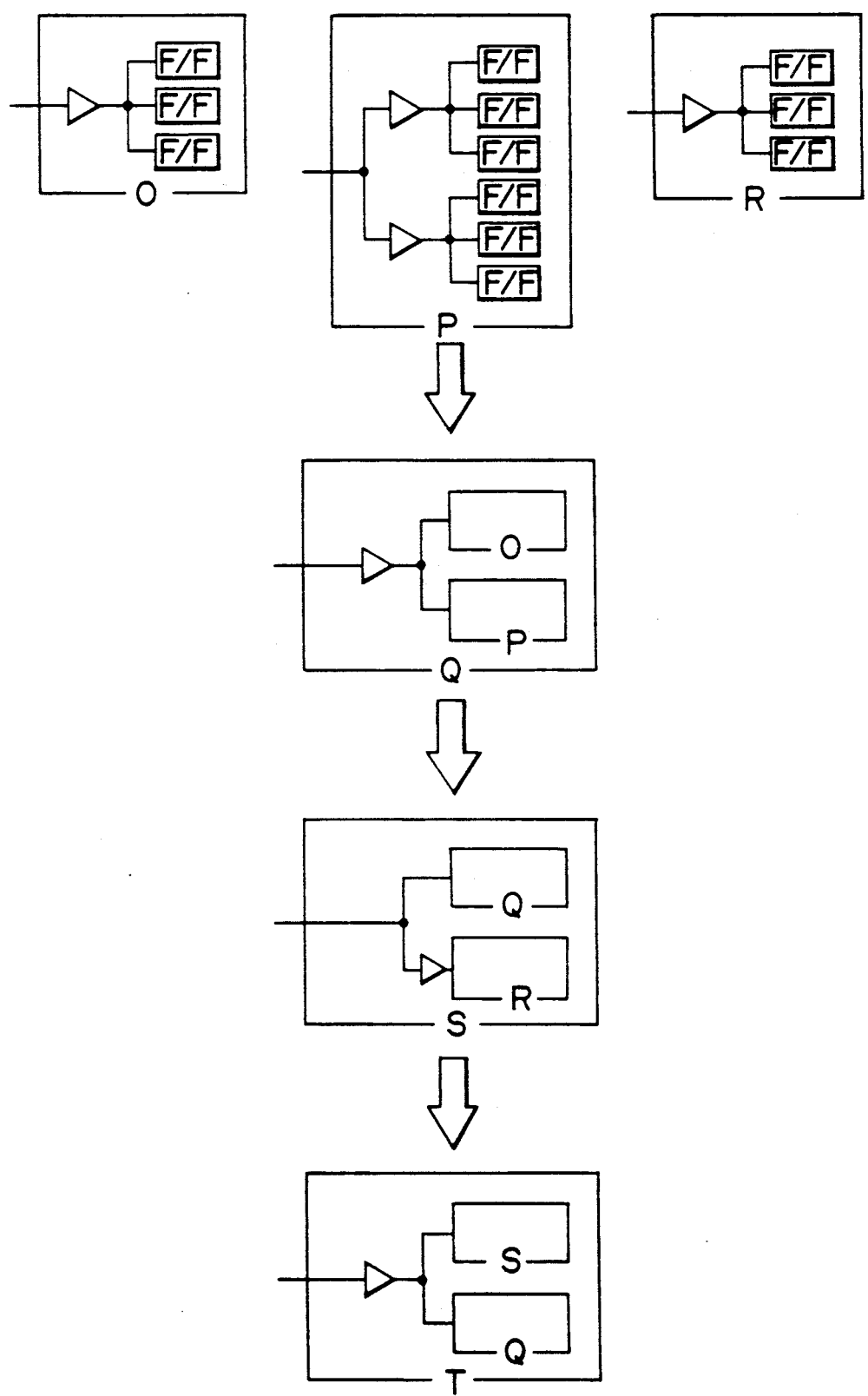
F I G. 14

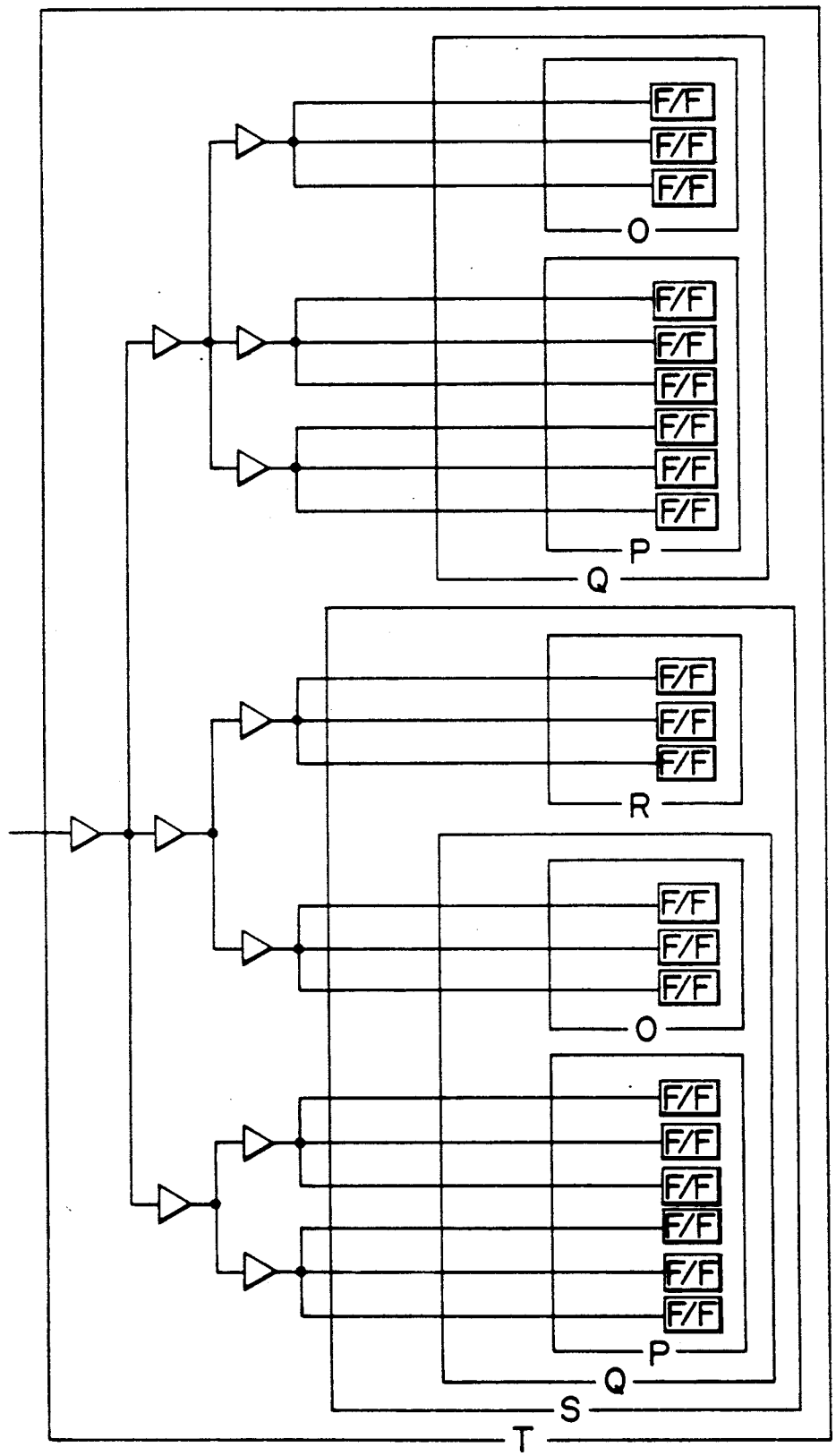
F I G. 17

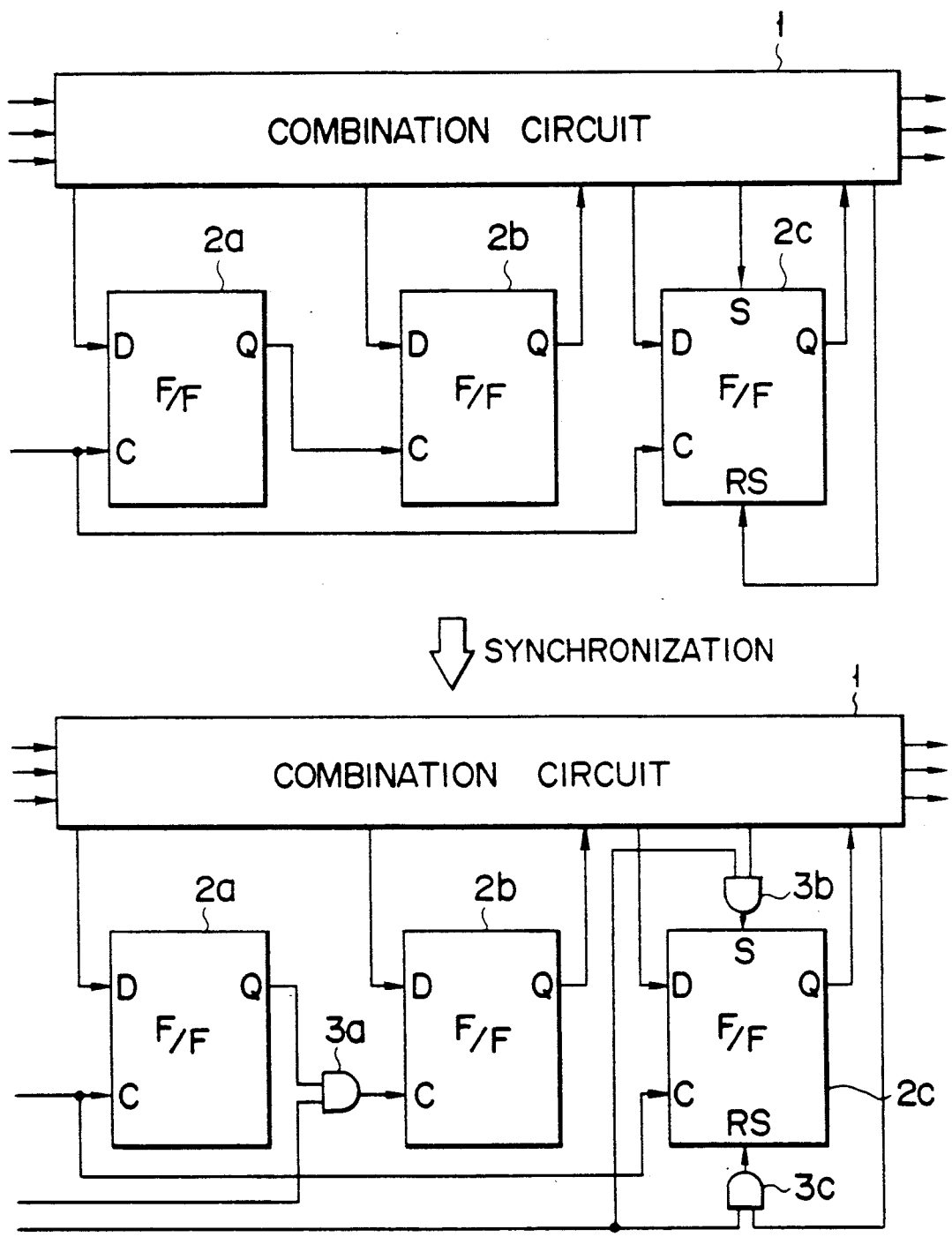
F I G. 18

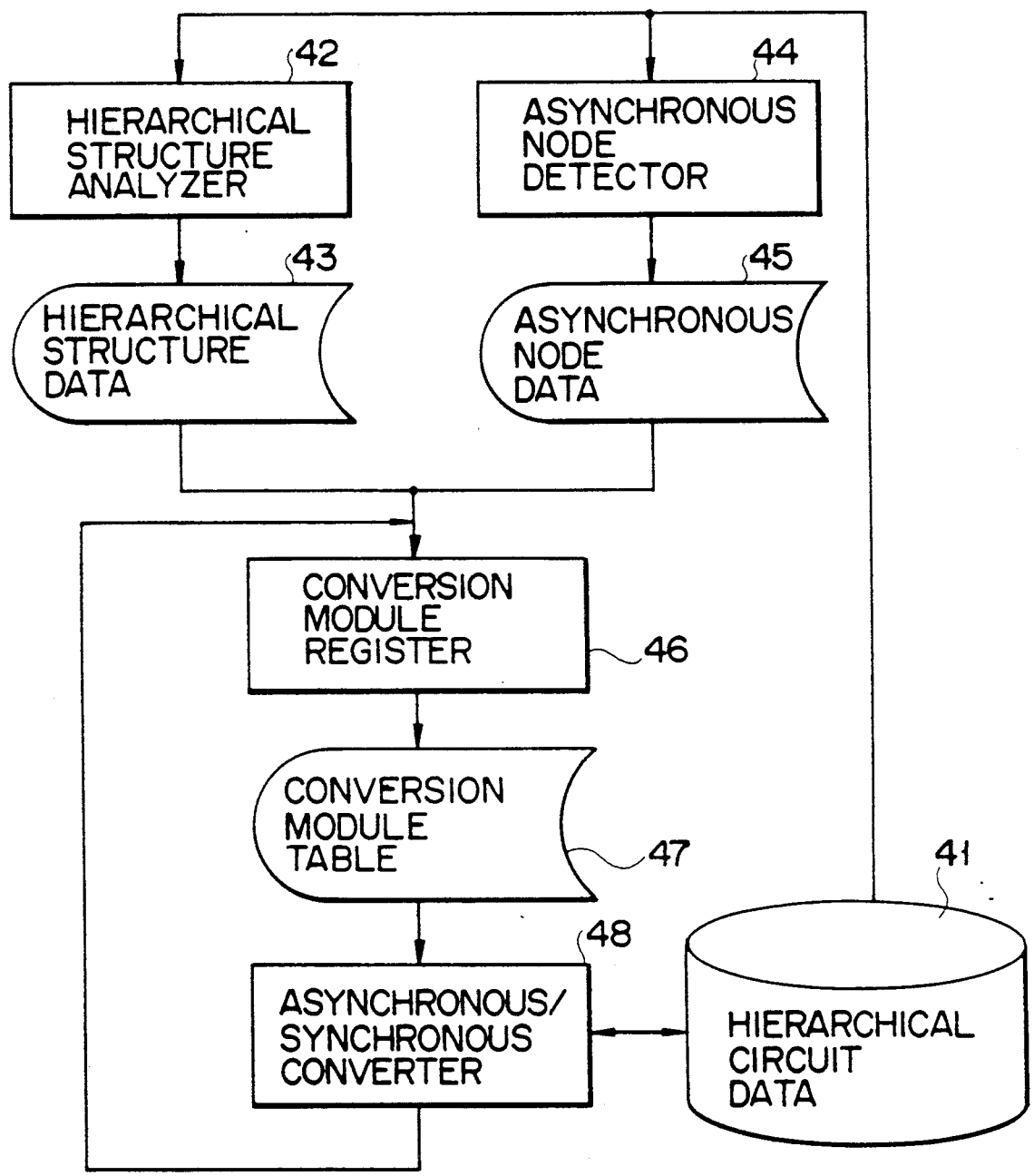
F I G. 19

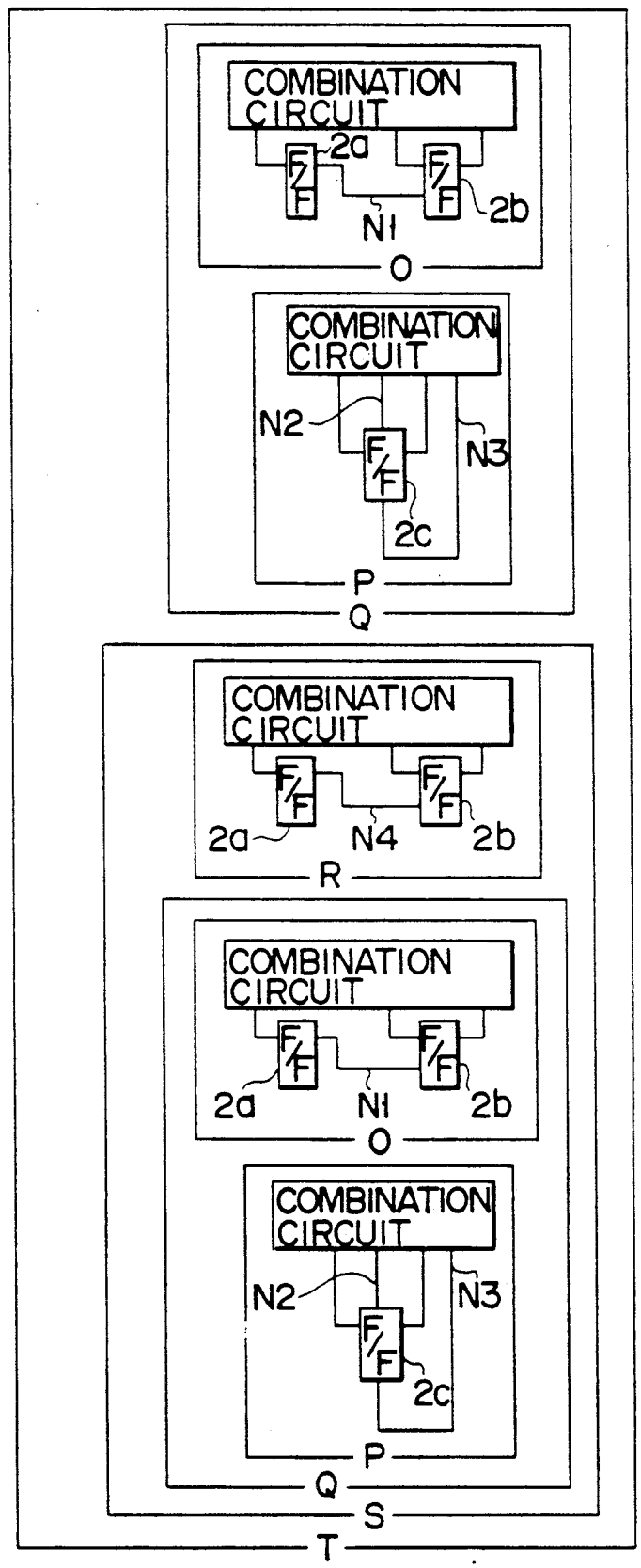
F I G. 20

CIRCUIT DESIGN CONVERSION APPARATUS

BACKGROUND OF THE INVENTION

1. Field of the Invention

The present invention relates to a circuit design conversion apparatus for performing a testing for defects of an LSI.

2. Description of the Related Art

Generally, LSI is a sequential logic and comprises combinational logic 1 and register 2 as shown in FIG. 1. Combinational logic 1 comprises AND gate, OR gate, etc., and register 2 comprise flip-flops 2a, 2b and 2c. On the other hands, test of LSI can immediately be implemented by comparing, with an expected responses, responses which are obtained by applying simply to primary inputs test data which comprises a greater number of data as referred to as data pattern. However, combinational logic 1 is controlled by output signals of register 2 and register 2 is controlled by output signals of combinational logic 1. The outputs of register 2 is changed only when the clock pulses (not shown in FIG. 1) are applied thereto. Therefore, the test pattern is complex, much time-consuming in its generation and longer in the test time.

For this reason, a testing of LSI (sequential circuit) is performed by a testing of combinational logic 1 and by a testing of register 2, respectively. In this procedure, the test pattern for combinational logic 1 can be automatically generated by an algorithm. The testing of register 2 can be replaced by a testing of operation of the shift register, therefore it can easily performed. In order to test the combinational logic and the shift register, LSI is converted to a scannable circuit such that flip-flops 2a to 2c are replaced by scannable flip-flops 2A to 2C; flip-flops 2A to 2C have their terminals SI and SO for a scan path connected to each other; and flip-flop 2A is applied an external scan clock SC, while being applied a test pattern at a scan input terminal SI, to allow flip-flops 2A to 2C to be scanned with test pattern data. This method of converting a circuit design is called a "scan design conversion" and a designing of an LSI as a scannable one is called a "design for testability" whereby it is easier to test LSI of the sequential circuit.

A conventional circuit design conversion apparatus comprises, as shown in FIG. 3, hierarchy flattening unit 4 and circuit design conversion unit 5. Hierarchy flattening unit 4 flattens hierarchical circuit data 6 for hierarchically describing the connection of modules, that is, basic circuit units, to obtain non-hierarchically flat circuit data 7. Circuit design conversion unit 5 refers to conversion rule 8 registered with circuit modules allowing a circuit design conversion, that is, registered with scannable modules to be connected by a scan path, and converts a flat circuit into scan design data 7.

FIG. 4 shows an example of a hierarchy flatting. If an example is taken of a circuit (module) J, made up of modules A to I, as indicated by an upper section in FIG. 4, it is flattened into a lower section as shown in FIG. 4. A lowest level units (modules A to F) of the module corresponds to flip-flops in FIG. 2. If modules A, C and D are registered in rule 8, then a scan designed circuit obtained by scan design conversion unit 5 becomes a connection as indicated by the lower section in FIG. 4, where modules A, C and D are connected by a scan path. This circuit (module J) is scannable.

In order to prevent a waveform from being degraded during the transmission of a scan clock SC, it is necessary to insert a buffer into the scan clock system, though not shown in the Figure, upon the occurrence of the scan design conversion. If there is any asynchronous node ( node directly not controlled by external terminal) in the associated circuit, it is necessary to convert, to a synchronous node which can be directly and externally controlled by inserting a gate at that node.

Since the scan design conversion based on the "design for testability" is implemented after input hierarchical circuit connection data has once been converted by the hierarchy flattening unit to non-hierarchical circuit connection data, the following drawbacks have been encountered.

First, the aforementioned system is time-consuming in the flattening of such circuit data and greater in an amount of data to be processed, resulting in a greater time consumed in the scan design conversion and hence in a whole time involved.

When the circuit connection is to be modified, it is only necessary to remedy a single site if the hierarchical structure is maintained. In actual practice, however, it is necessary to modify many sites in the flattening of the hierarchical structure, resulting a situation which is not only complex but also time-consuming.

Furthermore, upon the flattening of the hierarchical structure, a new node name is generated, thus increasing an extra operation for examining a match between the new node name and an internal node before the flattening of the hierarchical structure. Many inconveniences will also arise from the flattening of the hierarchical structure even at a design stage following an examination step.

SUMMARY OF THE INVENTION

It is accordingly the object of the present invention to provide a circuit design conversion apparatus which can convert a circuit design into a scan design while maintaining a hierarchical structure.

Another object of the present invention is to provide a circuit design conversion apparatus which, while holding a hierarchical structure, converts a circuit design into a scan design and inserts a scan clock buffer into a scan clock system.

Another object of the present invention is to provide a circuit design conversion apparatus which, even if a circuit contains any asynchronous nodes, can convert a circuit design into a scan design while holding a hierarchical structure.

A circuit design conversion apparatus of the present invention comprises a circuit data memory for storing a circuit data constructed of a greater number of modules having a hierarchical structure, a data memory for storing a data representing a scannable module, an analyzing unit for detecting the hierarchical structure from the circuit data, a unit for picking up a module higher in level than the scannable module by referring to the analyzed hierarchical structure data and for registering it in a module table, a unit for converting a circuit design into a scan design for each module registered in the module table, and a unit for picking up a module higher in level than the module after the circuit design conversion by referring to the analyzed hierarchical structure data and for remaking the module table.

BRIEF DESCRIPTION OF THE DRAWINGS

FIG. 5 is a block diagram showing a circuit design conversion apparatus according to a first embodiment of the present invention;

FIGS. 12A to 12D show a transfer of a circuit design conversion rule in the modification;

FIGS. 13A to 13D show a transfer of a circuit design conversion module table in the modification;

FIG. 14 shows a sequence of clock buffer connection in the modification;

FIG. 17 shows a final circuit connection of the second modification;

FIG. 18 is a view for explaining the conversion of asynchronous nodes to synchronous modes;

FIG. 19 is a block diagram showing a second embodiment of a circuit design conversion apparatus of the present invention;

FIG. 20 shows one circuit form which is input to the second embodiment;

DETAILED DESCRIPTION OF THE PREFERRED EMBODIMENTS

Figure 1:
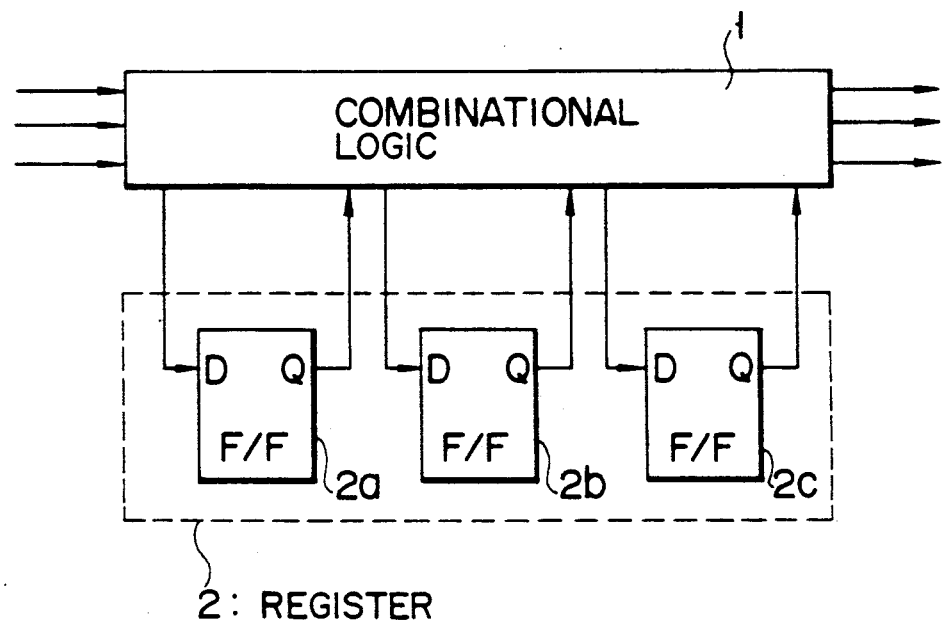
FIG. 1 shows an LSI's basic configuration.

FIG. 5 shows a block diagram showing a circuit design conversion apparatus according to one embodiment of the present invention. This embodiment comprises hierarchical circuit data memory 21, hierarchical structure analyzer 11, hierarchical structure data memory 22, conversion module register 12, conversion rule memory 23, conversion module table memory 24, conversion control unit 13, module pick-up unit 14, circuit design conversion unit 15 and conversion rule remake unit 16.

In the flow diagram shown in FIG. 5 the design conversion process is accomplished. Before starting this scan design conversion, circuit connection data, such as is shown in the upper portion of FIG. 4 and representing connections between the modules included in a circuit are previously stored in hierarchical circuit data memory 21 and a conversion rule indicating a scannable module of the circuit is previously stored in the conversion rule memory 23 such as is shown in FIG. 7.

Figure 6:
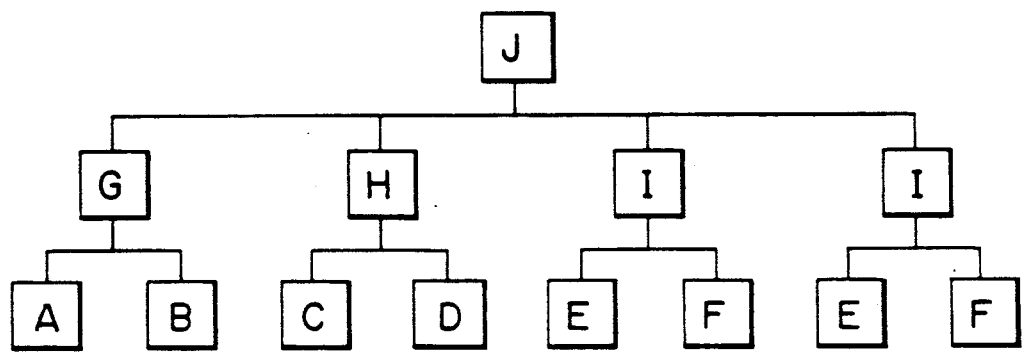
FIG. 6 shows hierarchical structure data.

First the circuit connection data is transferred from memory 21 to a hierarchical structure analyzer 11 and the hierarchical structure data representing that of the circuit shown in FIG. 6 is detected and is stored in a hierarchical structure data memory 22.

The conversion rule stored in the memory 23 and the hierarchical structure data stored in the memory 22 are then supplied to a conversion module register 12. Next the name of the module which is one level higher than the hierarchical structure than the module indicated by the conversion rule is detected and as is shown in FIG. 8 is stored in a conversion module table 24 by the conversion module register 12. A pointer P representing the sequence of modules which are to be scanned and designed is also included in this conversion module table 24.

Figure 4:
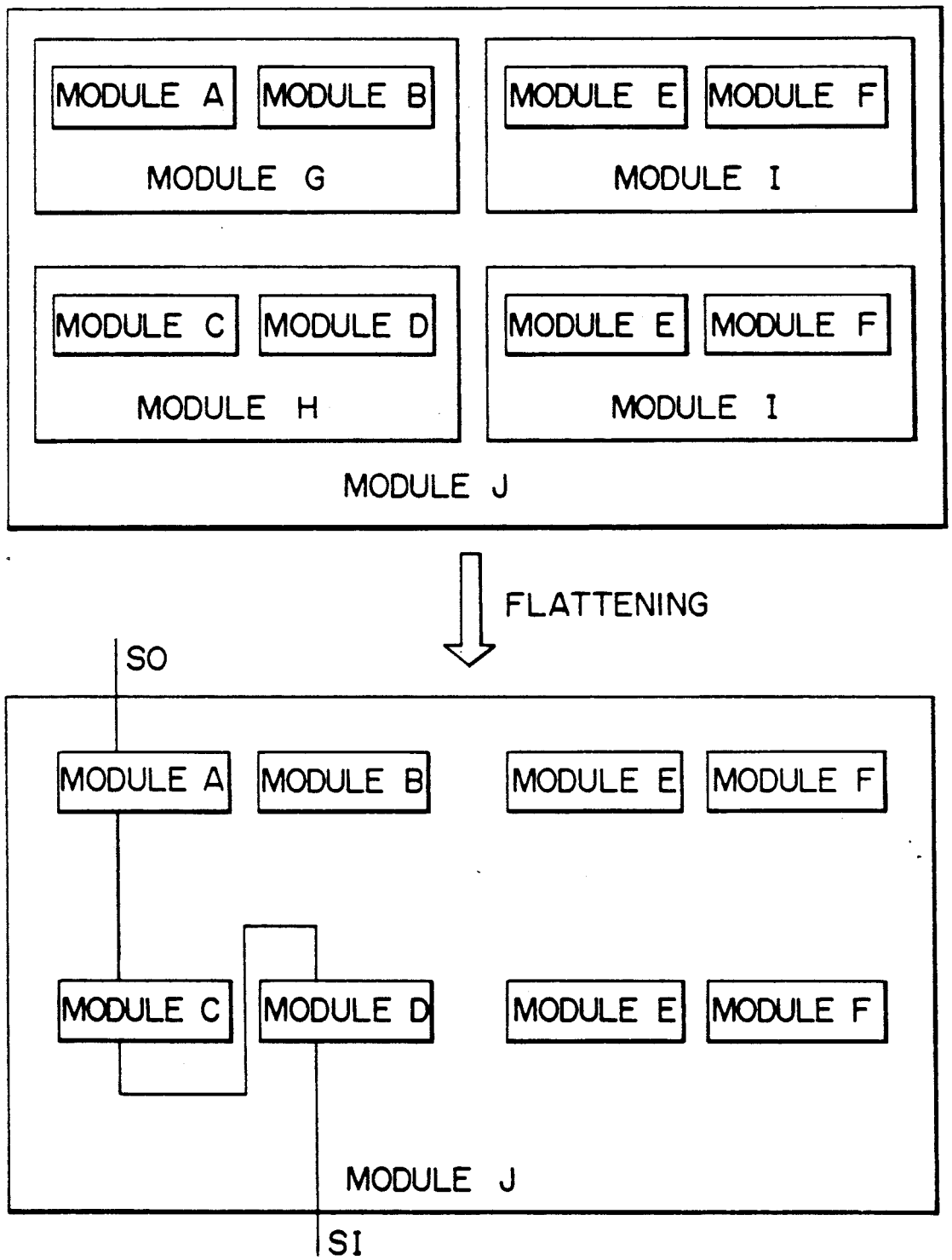
FIG. 4 is a view for explaining the flattening of a hierarchical structure in the conventional apparatus of FIG. 3.

Circuit connection data which hierarchically describes a connection of a circuit to be tested defects is supplied to hierarchical circuit data memory 21. Here, if the circuit as shown in FIG. 4 is given, then hierarchical structure analyzer 11 analyzes a circuit structure to obtain hierarchical structure data a shown in FIG. 6. The structure data is stored in hierarchical structure data memory unit 22.

Figure 2:
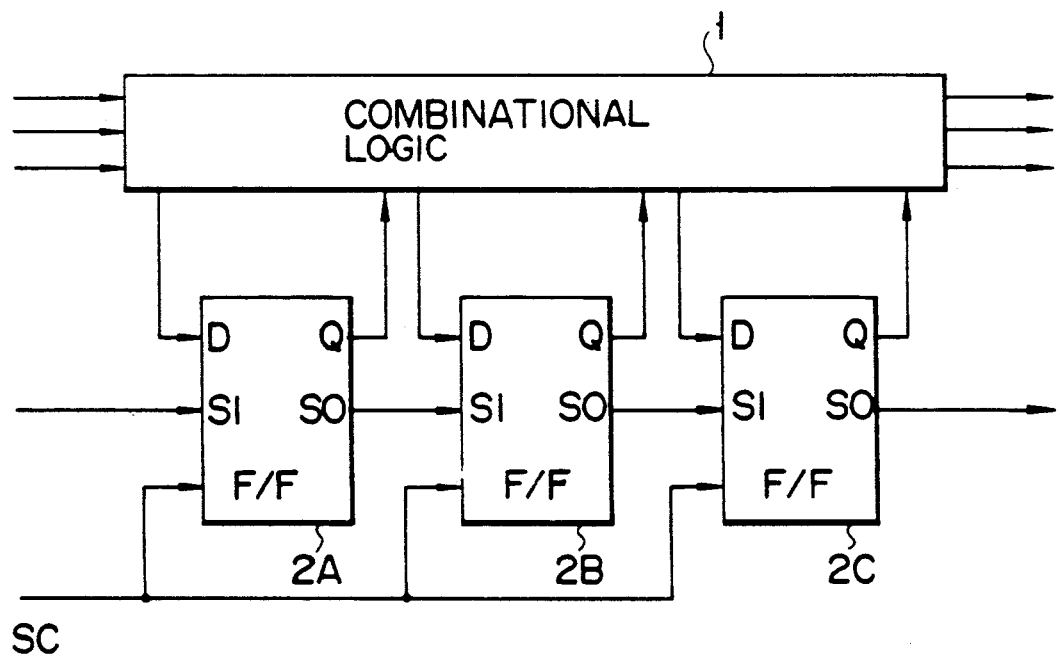
FIG. 2 shows scan designed circuit of FIG. 1.
Figure 3:
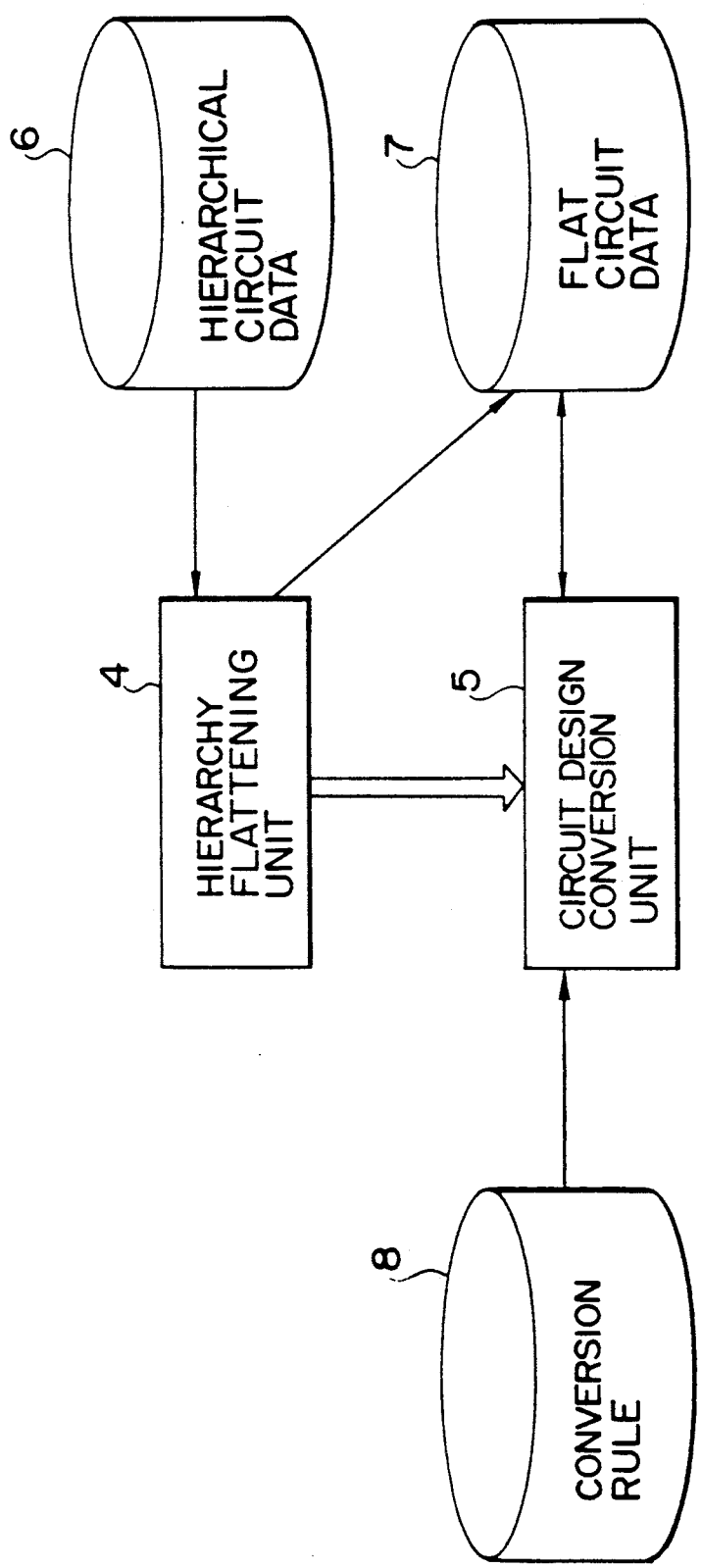
FIG. 3 is a block diagram showing a conventional circuit design conversion apparatus.

The name of a module, to be scan designed (to be connected by a scan path), of circuit modules is initially registered in conversion rule memory 23. Here, modules A, C and D are registered, as modules to be scan designed, as shown in FIG. 7A, that is, each of modules A, C and D corresponds to the scannable flip-flop as shown in FIG. 2.

Figure 7A:
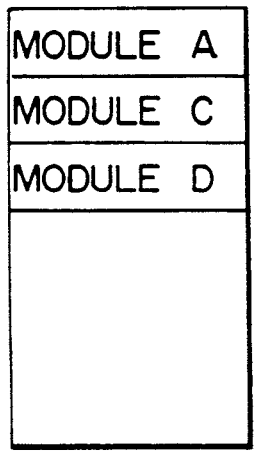
FIG. 7A to 7C show a transfer of a circuit design conversion rule.
Figure 8A:
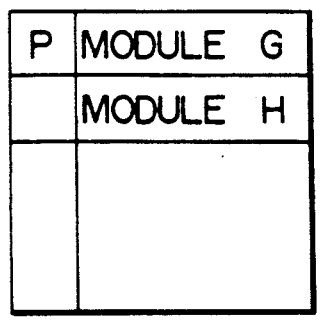
FIG. 8A to 8C show a transfer of a circuit design conversion module table.

In order to implement a scan designing with the hierarchical structure of modules A, C and D maintained, the names of one-level higher modules are registered in conversion module table memory 24, noting that, in this case, hierarchical structure data 22 as shown in FIG. 6 and conversion rule 23 as shown in FIG. 7A are taken into consideration. FIG. 8A shows a conversion module table which is obtained at that time. That is, a higher-level moduie for the module A is the module G and higher-level module for modules C and D is module H. In this case, these two modules G and H are registered in the conversion module table. The conversion module table includes a pointer P for representing a sequence of modules to be scan designed. Pointer P is first located in module G and, after being scan designed, shifted to the next module H.

Conversion control unit 13 supplies the name of the module pointed by pointer P to module pick-up unit 14. Module pick-up unit 14 picks up circuit connection data of module G, from hierarchical circuit data memory 21 on the basis of the aforementioned information and sent it to circuit design conversion unit 15.

Circuit design conversion unit 15 converts module G into scan design circuit. In this case, since module G includes only module A which is scannable, the conversion into the scan design circuit is such that, here, the scan terminals SI and SO of module A are connected to the external terminals of module G.

Figure 7B:
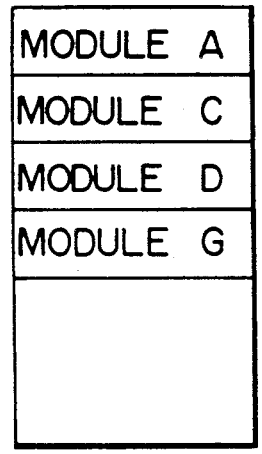

After the processing of module G, conversion rule remake unit 16 allows module G to be registered in the conversion rule as shown in FIG. 7B.

FIG. 8a represents an initial state of the conversion module table and FIGS. 8b and 8c as will be set forth below represent an updated table during the scan conversion.

Figure 8B:
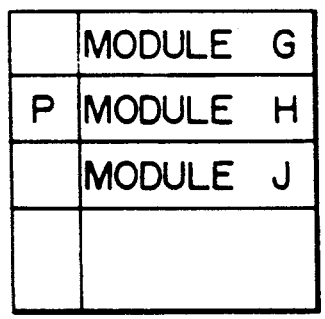
Figure 8C:
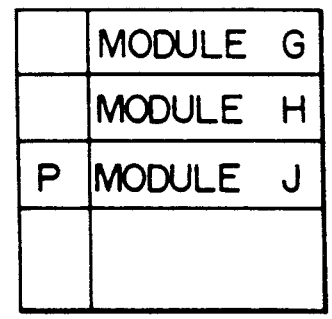

Then conversion module register 12 refers to a resultant new rule and hierarchical structure data and newly registers module J which is one-level higher than module G as shown in FIG. 8B in the module table and shifts pointer P one position so that module H is pointed out.

A conversion control unit 13 determines the name of the module to be scan-designed-converted in accordance with the pointer P in the conversion module table 24, the name of the module being supplied to the module pick-up unit 14 which picks-up the circuit connection data of the module in accordance with the hierarchical circuit data stored in the memory 21.

Then the circuit connection data of the module is supplied to the circuit design conversion unit 15 and is scan-designed-converted. After the scan-designed-conversion the circuit connection of one module, the conversion rule stored in the memory 23 is updated by the conversion rule remake unit 16 whereby the name of the scan-designed converter module is added to the conversion rule and the conversion module register 12 shifts the point P. The above procedure is repeated until the pointer P reaches the highest-level module.

Figure 7C:
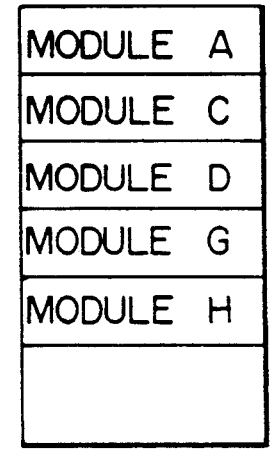
Figure 9:
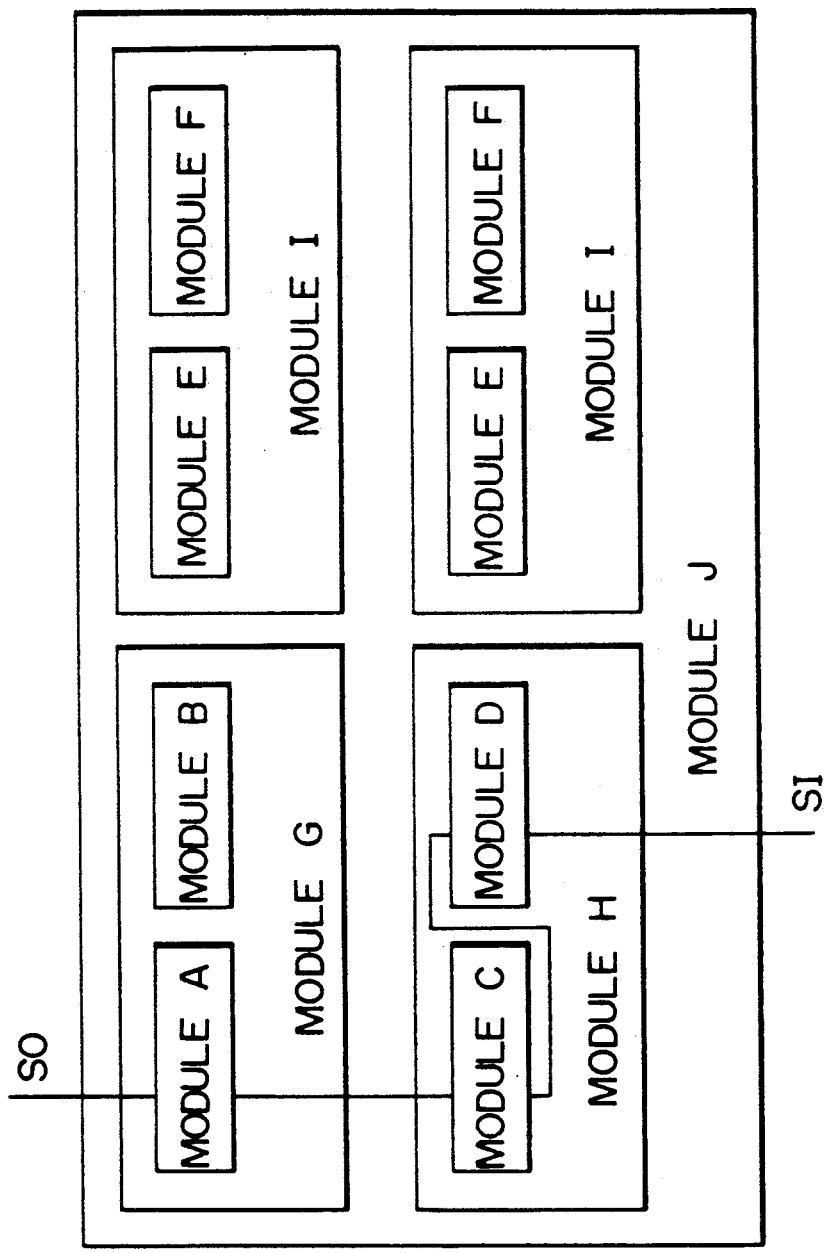
FIG. 9 is a view for explaining a scan designed circuit obtained by the first embodiment.

Likewise, the scan design conversion is carried out by circuit design conversion unit 15 with respect to module H and module H is newly registered in the conversion rule as shown in FIG. 7C. The scan design conversion of module H is such that the scannable modules C and D have their scan terminals SI and SO connected in series fashion. Since module J which is one-level higher than module H has already been registered in the module table as shown in FIG. 8B, any new module is not registered, at that time, in conversion module table memory 24. For this reason, as shown in FIG. 8C, pointer P is shifted to the next module, that is, module J, and the scan design conversion is performed for module J. Module J includes modules G and H as scannable ones and hence modules G and H are connected by the scan path using terminals SI and SO. Since there is no hierarchical module higher than module J, no new module is registered in the conversion module table. Pointer P already reaches the highest module J in the conversion module table as shown in FIG. 8C, thus terminating the automatic conversion of a scan design. Finally, the scan-designed circuit holds a hierarchical structure as shown in FIG. 9.

According to the first embodiment, the scan design conversion is carried out with the hierarchical circuit connection data holded in hierarchical structure, thus facilitating a scan design conversion with less data amount in comparison with a conventional way for achieving a scan design conversion after the hierarchical structure has been flattened as already set forth above.

Although in the first embodiment the scan design has been explained about only the connection of the modules by the scan path and the explanation of a scan clock system associated with respective modules is omitted, circuit design conversion unit 15 should be of such a type that a clock buffer is connected to a scan clock system so as to prevent degradation of a scan clock waveform. Explanation will now be given of an operation for determining its connection site, in conjunction with a modification of the first embodiment.

Figure 10:
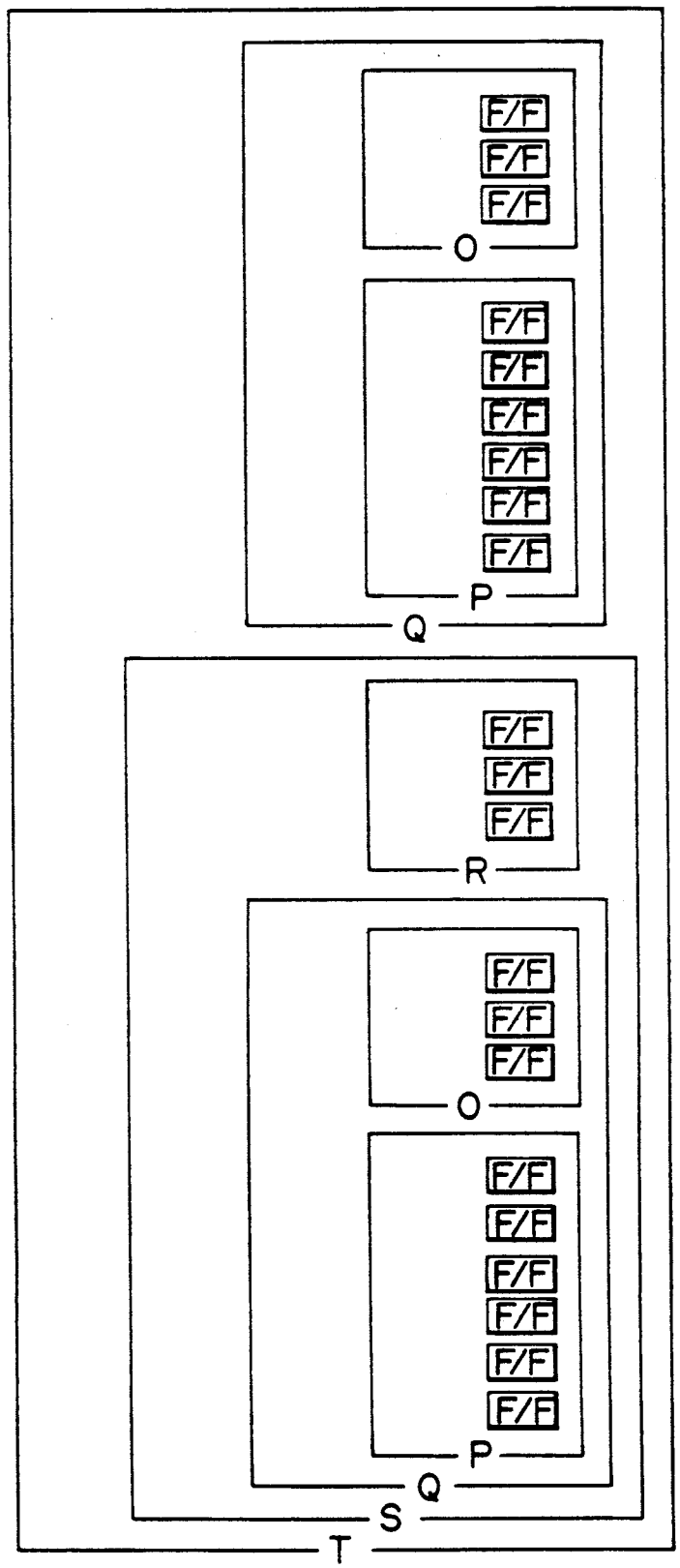
FIG. 10 shows one circuit structure relating to the connection sites of scan clock buffers in a modification of the first embodiment.
Figure 11:
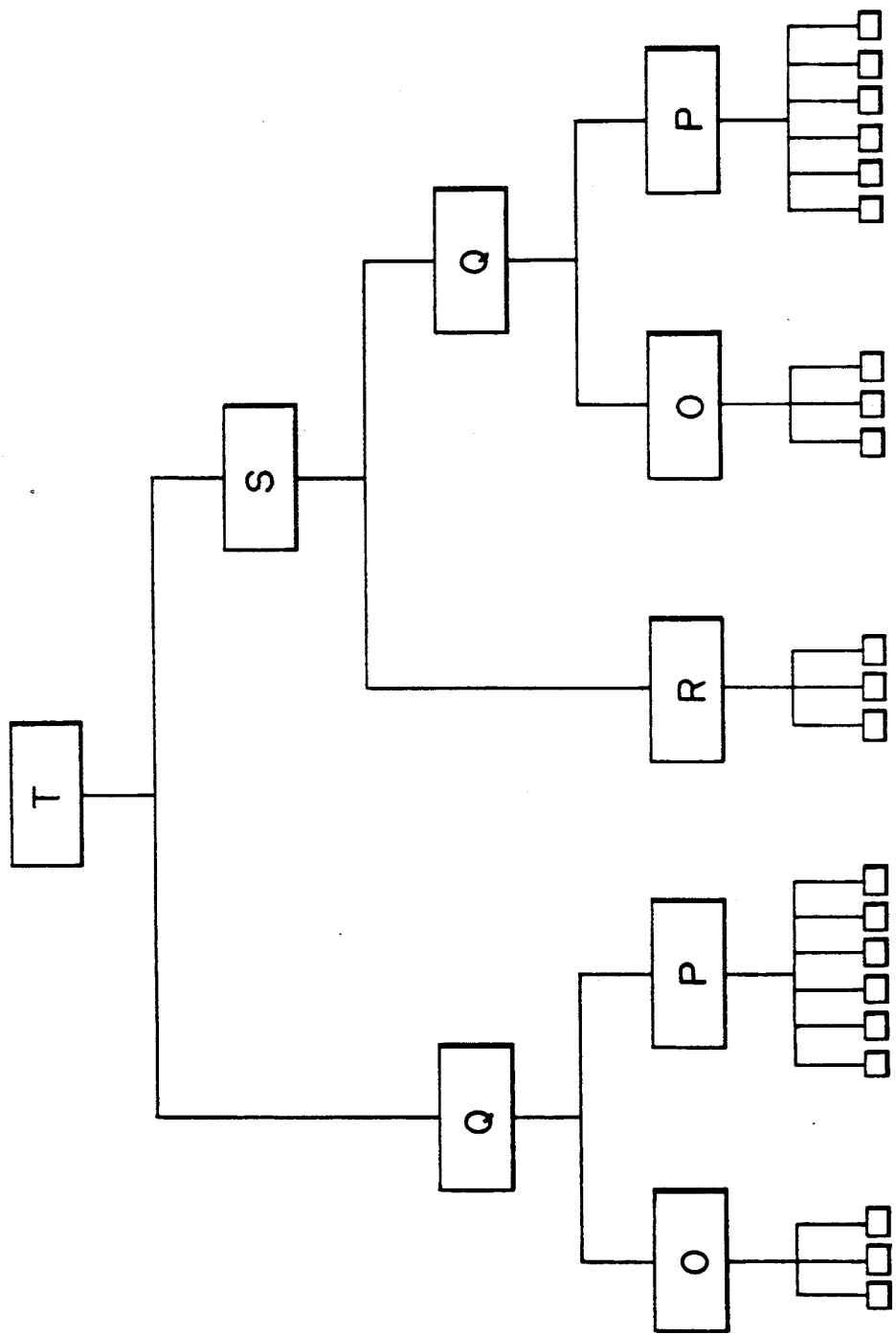
FIG. 11 shows the hierarchical structure data of the circuit of FIG. 10.

Here a circuit as shown in FIG. 10 will be explained about the hierarchical circuit connection data. In FIG. 10, respective flip-flops constitute the lowest module with their module name omitted in view of numerous flip-flops disclosed. For this reason, a hierarchical structure analyzed by hierarchical structure analyzer 11 will be as shown in FIG. 11 where the lowest hierarchical structure is shown as being flip-flops.

As shown in FIG. 12A, the lowest module (flip-flops) is registered in conversion rule memory unit 23.

With consideration given to the hierarchical structure data and rule as shown in FIG. 13A, conversion moduel register 12 registers, in the module table memory 24, modules O, P and R which are one-level higher than those modules registered in the rule, as shown in FIG. 13A.

Conversion control unit 13 supplies the module name which is pointed by pointer P to module pick-up unit 14 and, on the basis of the aforementioned information, module pick-up unit 14 picks up circuit connection data, regarding module O, from hierarchical circuit data 21 and is supplied to circuit design conversion unit 15.

In circuit design conversion unit 15, one clock buffer is connected to every predetermined number of flip-flops, here three flip-flops, in module O.

After the connection of the clock buffer to module O, conversion rule remake unit 16 newly registers module O in conversion rule memory unit 23.

Then conversion module register 12 refers to the new conversion rule and hierarchical structure data and registers module Q which is one-level higher than module O in the module table and shifts pointer P one position to designate module P.

Similarly, the connection of the clock buffer is achieved by circuit design conversion unit 15 with respect to modules P and R and modules O, P and R are newly registered in conversion rule memory 23 as shown in FIG. 12B.

At this time, modules Q and S is added to the module table as shown in FIG. 13B. FIG. 14 shows, at the topmost section, the connection state of the scan clock buffer relative to modules O, P and R.

The scan clock buffer is connected with respect to module Q pointed by the pointer. FIGS. 12C and 13C show the conversion rule and module table after the clock buffer has been connected respectively, as set out above, for module Q and FIG. 14 shows the circuit connection state as indicated by a second section next to the topmost section.

Furthermore, the connection of the clock buffer is achieved for a one-level higher module S. The resultant conversion rule and module table are shown in FIGS. 12D and 13D. The circuit connection state is shown in a third section next to the second section in FIG. 14.

Figure 15:
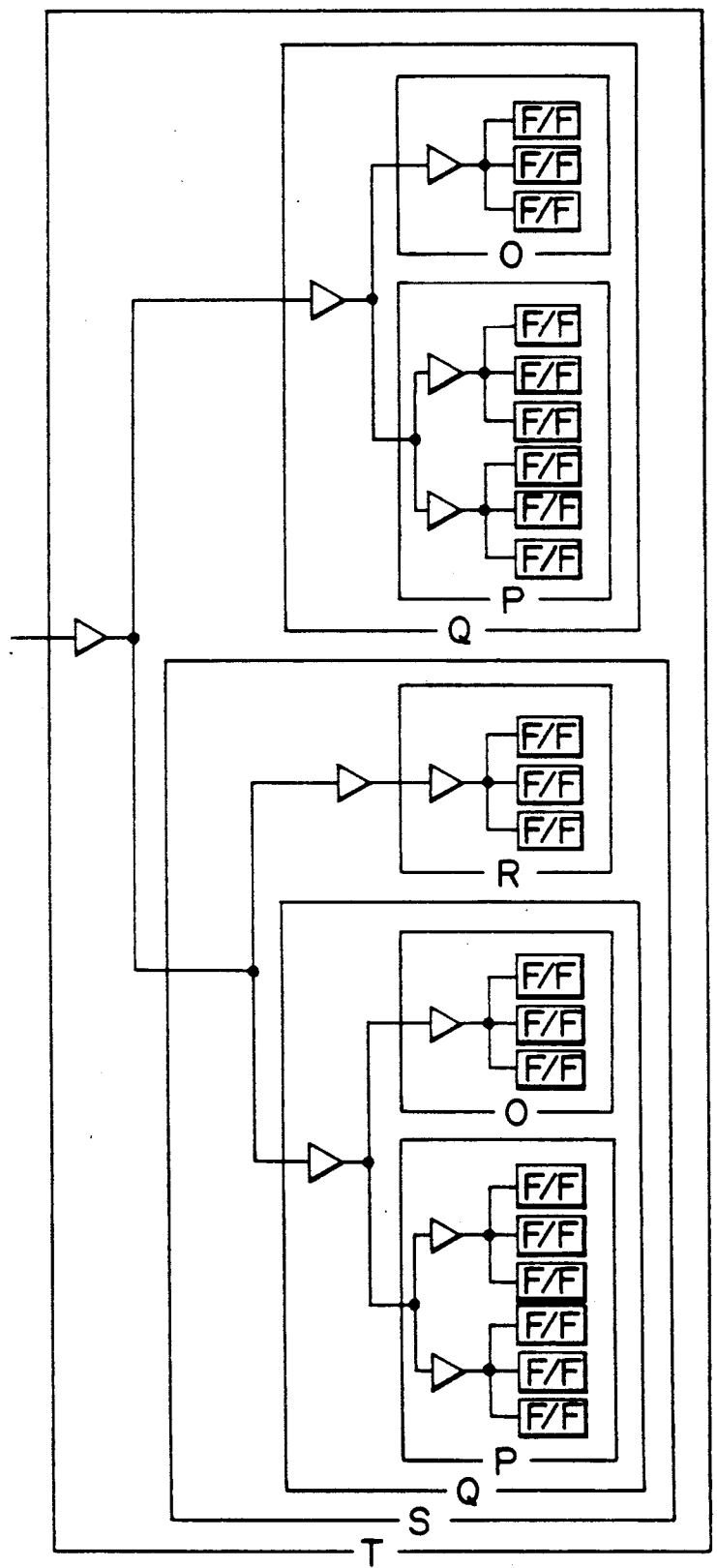
FIG. 15 shows a final circuit connection in the modification.

After the processing of module S has been completed, the pointer is shifted to module T and the connection of the scan clock buffer is conducted for the module T, as shown at the lowest section of FIG. 14. Since there is no hierarchical module higher than module T, no new module is registered in conversion module table memory 24. In the module table, pointer P has already reached the highest module T, thus completing the connection of the scan clock buffer. The final connection of the scan clock buffer holds a hierarchical structure as shown in FIG. 15.

In this modification, the clock buffer is connected for every module from the lower level to the higher level in the hierarchical structure such that buffers inserted into the scan clock system for every flip-flops are equally three in stage.

Figure 16:
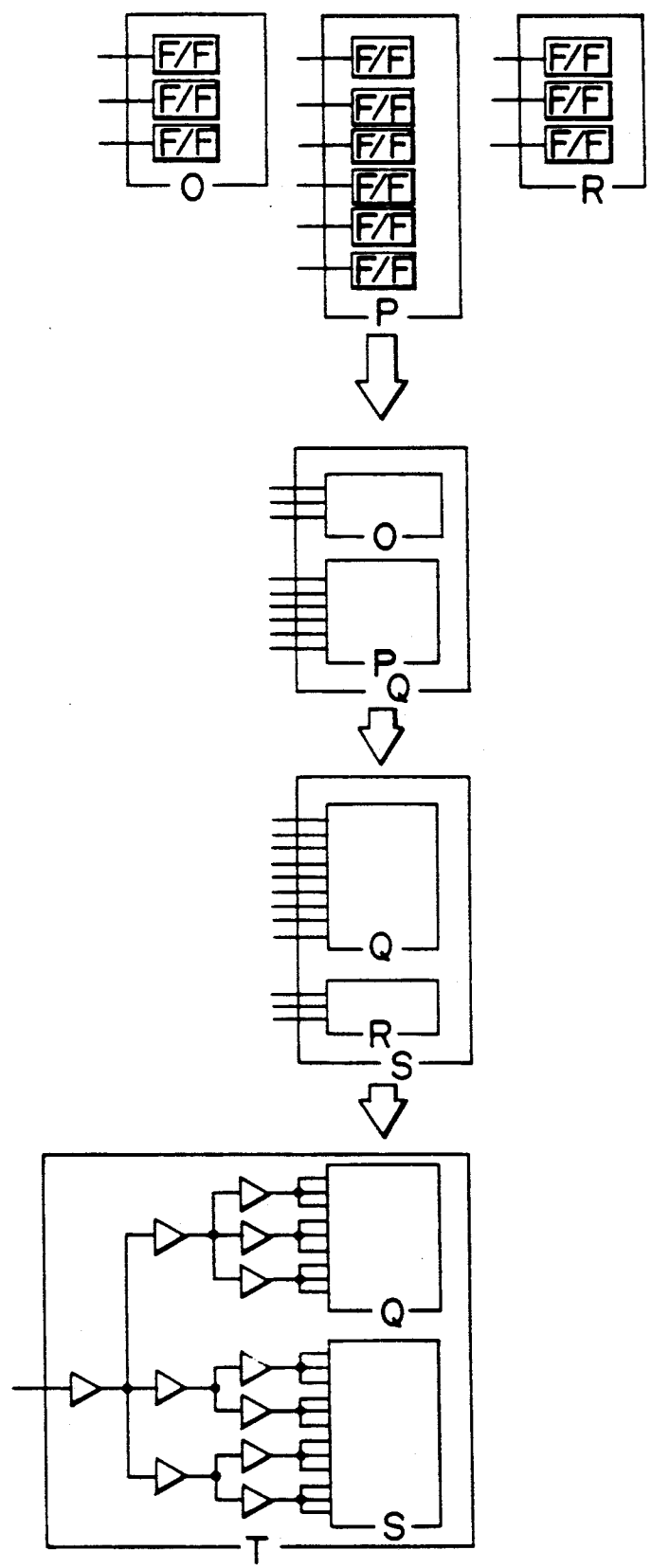
FIG. 16 shows a sequence of clock buffer connection of second modification.

In this modification, the flip-flops are arranged in a multiple of three per module, making it possible to use an equal number of flip-flops for the respective lowest level buffer. If the number of the flip-flops in the respective modules is unequal, there may be the case where the number of flip-flops connected to the lowest level buffers are unequal. This produces an unbalance among the drive capacities of the buffers. In this case, it is necessary to make such a connection as shown in FIG. 16.

That is, the scan clock terminals of respective flip-flops in a respective one of modules O, P and R are simply connected to the input terminals of the respective modules. Then the input terminals of modules O and P within module Q are connected to the input terminals of module Q, the input terminals of modules Q and R within module S are connected to the input terminals of module S and finally clock buffers are inserted, in a tree-like fashion, within the highest module T with the outputs of the clock buffers of the lowest stage connected to the input terminals of modules Q and S. In this case, the scan clock system as shown in FIG. 17 is finally created for module T. In the latter case, the clock buffer is arranged only within the highest module T whereby it can absorb any variation in the number of flip-flops within the lowest module.

A second embodiment of the present invention will now be explained below.

The second embodiment can achieve synchronization of asynchronous nodes, as set out below in connection with FIG. 18. Since clock (system clock) terminal C of flip-flop 2b and set terminal S and reset terminal RS of flip-flop 2c are asynchrous nodes, that is, nodes which cannot be externally controlled, AND gates 3a, 3b and 3c are connected to terminal C of flip-flop 2b and terminals S and RS of flip-flop 2C, respectively, in which case their gate control signals are employed as external control signals to achieve synchronization of terminals C, S and RS. The synchronization may be implemented separately before and after, or at the same time as the conversion into scan design.

FIG. 19 is a block diagram showing the second embodiment of the present invention. The second embodiment comprises hierarchical circuit data memory 41, hierarchical structure analyzer 42, hierarchical structure data memory 43, asynchronous mode detector 44, asynchronous node data memory 45, conversion module register 46, conversion module table memory 47 and asynchronous/synchronous converter 48.

A circuit as shown in FIG. 20 is assumed to be input for hierarchical circuit data memory 41. The hierarchical structure of this circuit is the same as in FIG. 10 in which the hierarchical structure data is shown in FIG. 11.

In this case, respective module is constructed of one or more of three flip-flops 3a, 3b and 3c shown in FIG. 18. In this example, node N1 (clock terminal C of flip-flop 2b) of module O, nodes N2 and N3 (set terminal S and reset terminal RS of flip-flop 2c) of module P and node N4 (clock terminal C of flip-flop 2b) of module R are detected by asynchronous node detector 44 as asynchronous nodes.

Conversion module register 46 registers, in conversion module table memory 47, the lowest modules O, P and R containing asynchronous nodes N1 to N4 to be converted. To this end, the asynchronous nodes of modules O, P and R are converted to synchronous nodes.

Module Q which is one-level higher than modules O, P and R is registered in the conversion module table to achieve synchronization of module Q. In a similar way as set out above, modules S and T are sequentially registered in the conversion module table to achieve synchronization of modules S and T.

Figure 21:
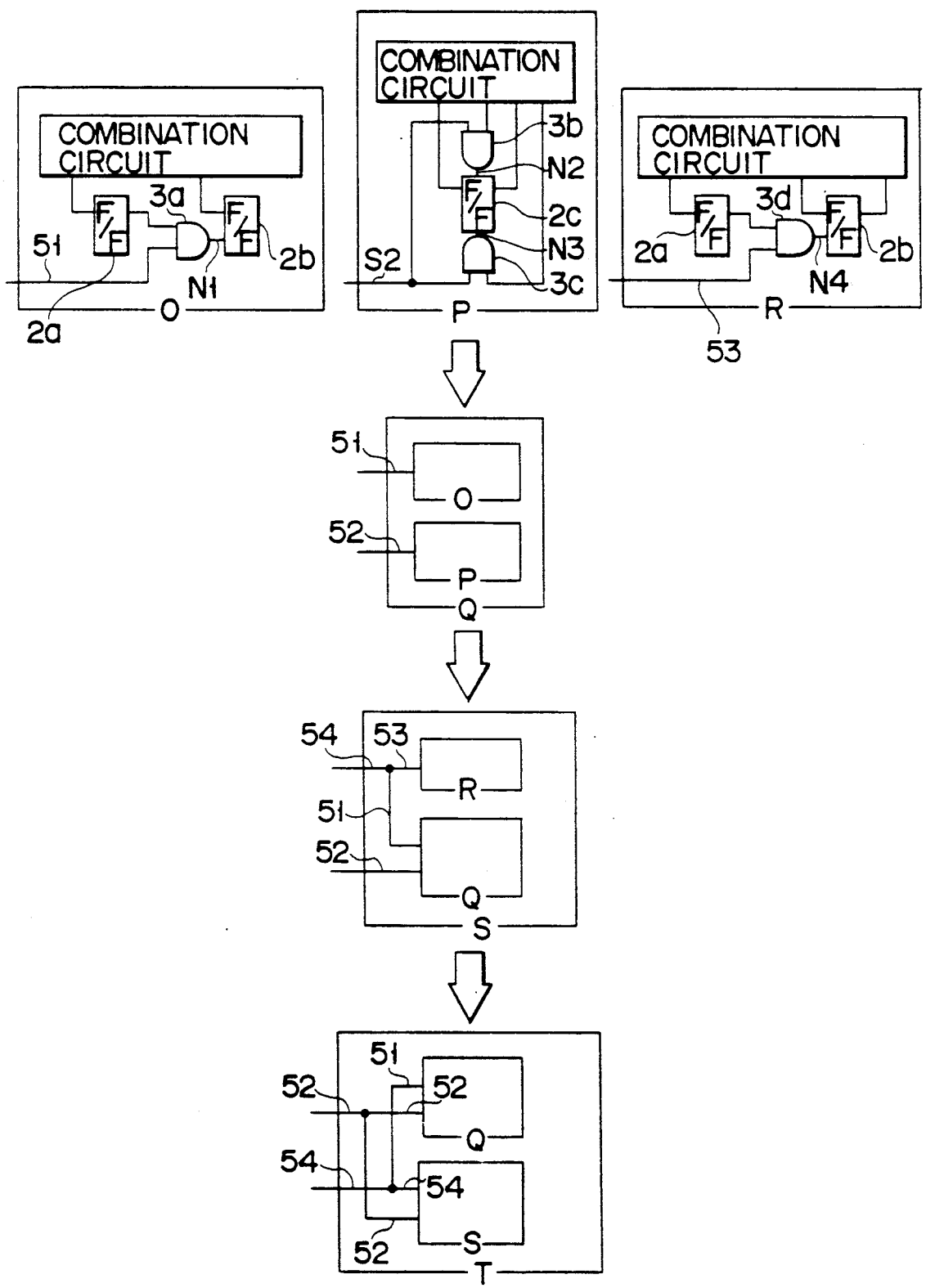
FIG. 21 shows a sequence of mode-synchronization in the second embodiment.

The aforementioned synchronization is implemented as shown in FIG. 21. As indicated by the topmost section in FIG. 21, AND gate 3a is inserted in asynchronous node N1 of module O so that one input 51 of AND gate 3a is connected to an external input of moduel O; AND gate 3b and 3c are inserted in asynchronous nodes N2 and N3 of module P and one input of AND gate 3b and that of AND gate 3c are commonly connected to each other so that their common connection input 52 is connected to an external input of module P; and AND gate 3d is inserted in asynchronous node N4 of module R so that one input 53 of AND gate 3d is connected to an external input of module R.

As indicated by a second section next to the topmost section in FIG. 21, external inputs 51 and 52 of modules O and P are connected to external inputs of module Q. As indicated by a third section next to the second section in FIG. 21, the external inputs of modules R and Q are connected to external inputs of module S. Here, since modules R and Q have the same type of inputs, external input 53 of module R and one external input 51 of module Q are commonly connected to provide external input 54. As indicated by a fourth section (lowest section) next to the third section in FIG. 21, the external inputs of modules Q and S are connected to the external inputs of module T. Here, since modules Q and S have the same type of inputs, their corresponding inputs are commonly connected to each other.

Figure 22:
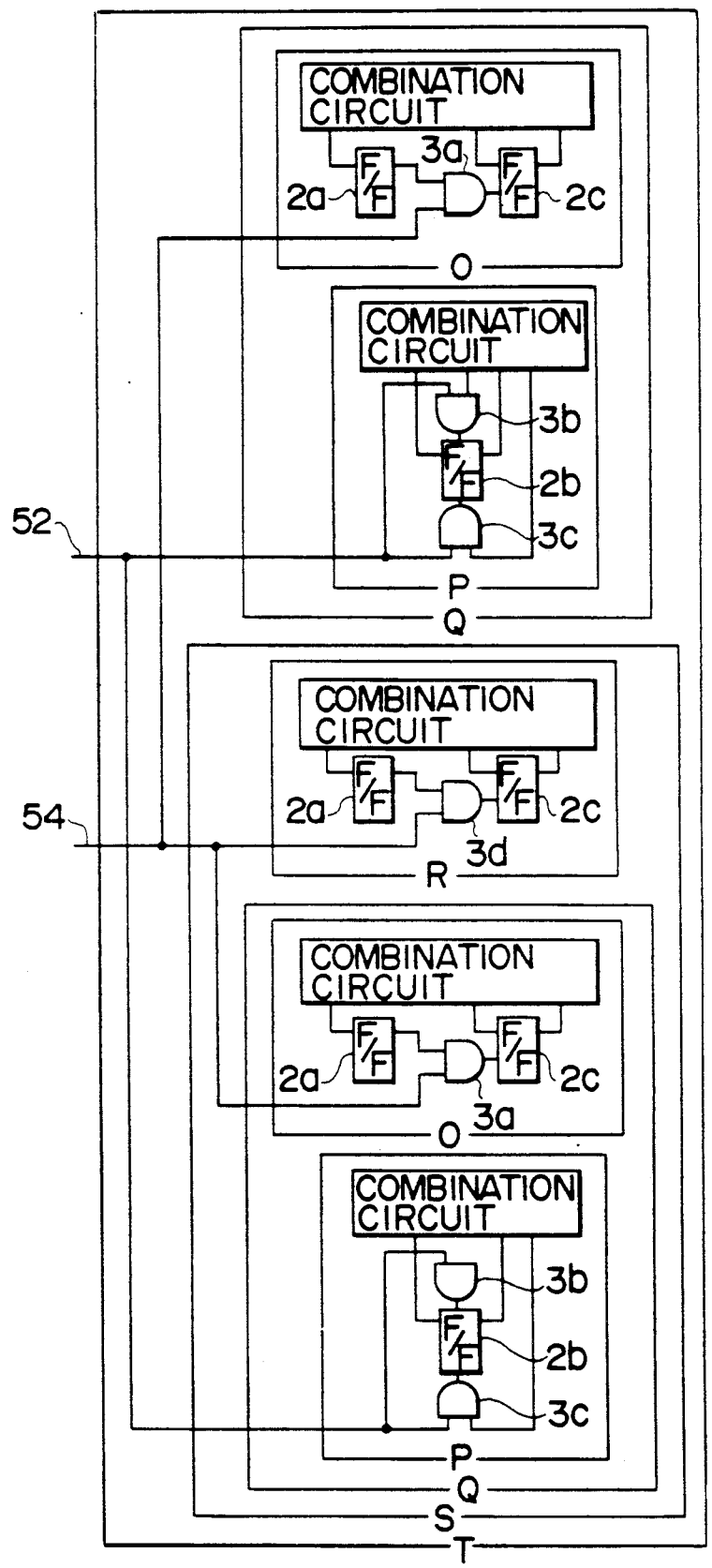
FIG. 22 shows a final circuit connection in the second embodiment.

Finally, a circuit connection is obtained which is shown in FIG. 22. As set out in FIG. 22, asynchronous nodes of the aforementioned modules can be controlled by two external inputs 52 and 54 to obtain synchronization.

According to the second embodiment of the present invention, it is possible to convert the asynchronous nodes to the synchronous nodes, while hierarchically holding the aforementioned hierarchical circuit connection data structure.

What is claimed is:

1. A circuit design conversion apparatus responsive to circuit connection data representing connection between modules of a circuit with an hierarchical structure, hierarchical structure data representing the hierarchical structure of the circuit, and a conversion rule indicating a scannable module of the circuit, comprising:

means for providing a conversion module table representing modules higher in level than the scannable module indicated by the conversion rule, in accordance with the hierarchical structure data and the conversion rule, the table including a pointer indicating the module to be scan-design-converted;

circuit design converting means for converting the circuit connection data of the module indicated by the pointer of said conversion module table into a scannable design; and updating means for adding the name of the module which is scan-design-converted into said conversion rule, adding the name of the module higher in level than the module which is scan-design-converted into said conversion module table, and shifting the pointer of said conversion module table in accordance with the name of the module which is scan-design-converted.

2. An apparatus according to claim 1, in which said circuit design converting means includes means for replacing modules in the conversion module table by scannable modules and means for connecting the scannable modules by a scan path.

3. An apparatus according to claim 1, in which said circuit design converting means includes means for connecting scan clock buffers in a tree-like fashion to the scannable modules such that an equal number of stages of scan clock buffers are connected to each of the scannable modules and that a substantially equal number of scannable modules are connected to each of the scan clock buffers.

4. An apparatus according to claim 3, in which said circuit design converting means includes means for connecting scan clock buffers of a respective stage within a respective module.

5. An apparatus according to claim 3, in which said circuit design converting means includes means for connecting scan clock buffers of all stages within a highest module.

6. The converter according to claim 1, in which said circuit design converting means includes means for detecting an asynchronous node within the module and means for inserting a gate to the detected asynchronous node, one input of the gate being connected to an external input of the module.

7. An apparatus for converting into a scan design a circuit design of a circuit including modules formed of a combinational logic circuit and a register, the modules being a scannable module and nonscannable module, said apparatus comprising:
  means for inputting a circuit design of the circuit representing connection of modules with a hierarchical structure and names of the scannable modules;
  means for analyzing the circuit design input by said inputting means, to detect the hierarchical structure;
  module table means for storing names of the modules of which the circuit design is converted into the scan design, in accordance with the names of the scannable modules input by said inputting means, the module table means having a pointer for representing the name of the module of which the circuit design is to be converted into the scan design next;
  circuit design converting means for selecting the circuit design of the module represented by the pointer of said module table means from the circuit design input by said inputting means, and converting the circuit design of the selected module into the scan design by interconnecting the scannable modules by a scan path; and
  control means for registering in said module table means a name of a module higher in level than the module of which the circuit design is converted into the scan design by said circuit design converting means, shifting the pointer in said modules table means, and stopping circuit design conversion by said circuit design converting means when the pointer does not represent any module.

8. An apparatus according to claim 7, in which a module higher than a module containing a scannable module within said circuit design is initially set to said module table means.

9. An apparatus according to claim 7, in which said control means further comprises a conversion rule memory for registering a name of a module of modules in said circuit data in which a scan design has already converted, in which the name of said module after the conversion into the scan design circuit thereof is registered in a conversion rule memory and, upon the reference of the registered name of a module in said rule memory, a module higher in level than said module is registered in said module table means.

10. An apparatus according to claim 7, in which said circuit design converting means includes means for replacing modules in the conversion module table by scannable modules and means for connecting the scannable modules by a scan path.

11. An apparatus according to claim 7, in which said circuit design converting means includes means for connecting a greater number of scan clock buffers in a tree-like fashion to the scannable modules such that an equal number of stages of scan clock buffers are connected to each of the scannable modules and that a substantially equal number of scannable modules are connected to each of the scan clock buffers.

12. An apparatus according to claim 11, in which said circuit design converting means includes means for connecting scan clock buffers of a respective stage within a respective module.

13. An apparatus according to claim 11, in which said circuit design converting means includes means for connecting scan clock buffers of all stages within a highest module.

14. An apparatus according to claim 7, in which said circuit design converting means includes means for detecting an asynchronous node within the module and means for inserting a gate to the detected asynchronous node, one input of the gate being connected to an external input of the module.

* * * * *